United States Patent
Liao et al.

(10) Patent No.: US 10,437,365 B2
(45) Date of Patent: Oct. 8, 2019

(54) DRIVER INTEGRATED CIRCUIT OF TOUCH PANEL AND ASSOCIATED DRIVING METHOD

(71) Applicant: PixArt Imaging Inc., Hsin-Chu (TW)

(72) Inventors: Chi-Chieh Liao, Hsin-Chu (TW); Che-Chia Hsu, Hsin-Chu (TW); Yu-Han Chen, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 15/730,698

(22) Filed: Oct. 11, 2017

(65) Prior Publication Data
US 2019/0107907 A1   Apr. 11, 2019

(51) Int. Cl.
G06F 3/041   (2006.01)
G06F 3/044   (2006.01)
H03M 1/12   (2006.01)

(52) U.S. Cl.
CPC ............ *G06F 3/0412* (2013.01); *G06F 3/044* (2013.01); *G06F 3/0416* (2013.01); *G06F 3/0446* (2019.05); *G06F 3/04166* (2019.05); *H03M 1/12* (2013.01)

(58) Field of Classification Search
CPC ...... G06F 3/0412; G06F 3/0416; G06F 3/044; H03M 1/12
See application file for complete search history.

(56) References Cited

U.S. PATENT DOCUMENTS

| | | | | |
|---|---|---|---|---|
| 5,648,642 A | * | 7/1997 | Miller | G06F 1/1626 178/18.06 |
| 8,810,263 B1 | * | 8/2014 | Wilson | G01R 27/26 324/658 |
| 2006/0114247 A1 | * | 6/2006 | Brown | G02F 1/13338 345/204 |
| 2009/0322351 A1 | * | 12/2009 | McLeod | G06F 3/0416 324/658 |
| 2010/0001973 A1 | * | 1/2010 | Hotelling | G02F 1/13338 345/174 |
| 2010/0289758 A1 | * | 11/2010 | Matsubara | G06F 3/0416 345/173 |
| 2011/0074446 A1 | * | 3/2011 | Chou | G06F 3/0418 324/679 |
| 2011/0115742 A1 | | 5/2011 | Sobel | |
| 2011/0193817 A1 | * | 8/2011 | Byun | G06F 3/0418 345/174 |
| 2011/0210938 A1 | * | 9/2011 | Kuang | G06F 3/0418 345/174 |
| 2012/0050209 A1 | | 3/2012 | King | |

(Continued)

FOREIGN PATENT DOCUMENTS

EP   3144790   3/2017

*Primary Examiner* — Mihir K Rayan
(74) *Attorney, Agent, or Firm* — Winston Hsu

(57) ABSTRACT

A driver integrated circuit (IC) includes: a built-in capacitor, a reading circuit, an analog-to-digital converter (ADC) and a coupling circuit, wherein the reading circuit receives a sensing signal from a touch panel and outputs an analog sensing data; the ADC is coupled to the reading circuit, and is used to receive and convert the analog sensing data to a digital sensing data; and the coupling circuit is coupled to the reading circuit, and is used to selectively couple the built-in capacitor to the touch panel when the driver IC operates in a touch sensing mode.

18 Claims, 3 Drawing Sheets

(56) References Cited

U.S. PATENT DOCUMENTS

| | | |
|---|---|---|
| 2013/0249853 A1* | 9/2013 | Tanaka .................... G06F 3/044 345/174 |
| 2013/0278560 A1 | 10/2013 | Yamaguchi |
| 2013/0328828 A1 | 12/2013 | Tate |
| 2014/0267108 A1 | 9/2014 | Chung |
| 2015/0002448 A1 | 1/2015 | Brunet |
| 2015/0177945 A1 | 6/2015 | Sengupta |
| 2015/0309610 A1 | 10/2015 | Rabii |
| 2015/0317008 A1 | 11/2015 | Chandran |
| 2015/0338964 A1 | 11/2015 | King |
| 2016/0098147 A1 | 4/2016 | Hills |
| 2016/0154507 A1 | 6/2016 | Bharathan |

* cited by examiner

DRIVER INTEGRATED CIRCUIT OF TOUCH PANEL AND ASSOCIATED DRIVING METHOD

BACKGROUND OF THE INVENTION

1. Field of the Invention

The present invention relates to a driver integrated circuit (IC), and more particularly, to a driver IC capable of adjusting the sensitivity of a touch panel coupled to the driver IC, and an associated driving method.

2. Description of the Prior Art

Conventionally, the sensitivity of a touch panel (in a laptop, for example) is fixed, as the arrangement of sensing electrodes formed in said touch panel cannot be changed once it has left the factory. This fixed sensitivity may result in some inconvenience in scenarios where users may not touch the panel directly; for example, when a user's hands are positioned above the panel without direct touch, the touch panel may not have enough sensitivity to complete the operation for the users.

SUMMARY OF THE INVENTION

One of the objectives of the present invention is to provide a driver IC of a touch panel and an associated driving method to solve the aforementioned problem.

According to the embodiment of the present invention, a driver integrated circuit (IC) is disclosed. The driving IC comprises a built-in capacitor, a reading circuit, an analog-to-digital converter (ADC) and a coupling circuit, wherein the reading circuit is arranged to receive a sensing signal from a touch panel and output an analog sensing data; the ADC is coupled to the reading circuit and arranged to receive and convert the analog sensing data to a digital sensing data; and the coupling circuit is coupled to the reading circuit and arranged to selectively couple the built-in capacitor to the touch panel when the driver IC operates in a touch sensing mode.

According to an embodiment of the present invention, a driving method of a touch panel is disclosed. The driving method comprises the following steps: receiving a sensing signal from the touch panel; outputting an analog sensing data; performing an analog-to-digital conversion upon the analog sensing data to convert the analog sensing data to a digital sensing data; and selectively coupling a built-in capacitor to the touch panel when it operates in a touch sensing mode.

According to an embodiment of the present invention, a touch-controlled system is disclosed, comprising: a touch panel and a driver integrated circuit (IC) coupled to the touch panel. The driving IC comprises a built-in capacitor, a reading circuit, an analog-to-digital converter (ADC) and a coupling circuit, wherein the reading circuit is arranged to receive a sensing signal from the touch panel and output an analog sensing data; the ADC is coupled to the reading circuit and arranged to receive and convert the analog sensing data to a digital sensing data; and the coupling circuit is coupled to the reading circuit and arranged to selectively couple the built-in capacitor to the touch panel when the driver IC operates in a touch sensing mode.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
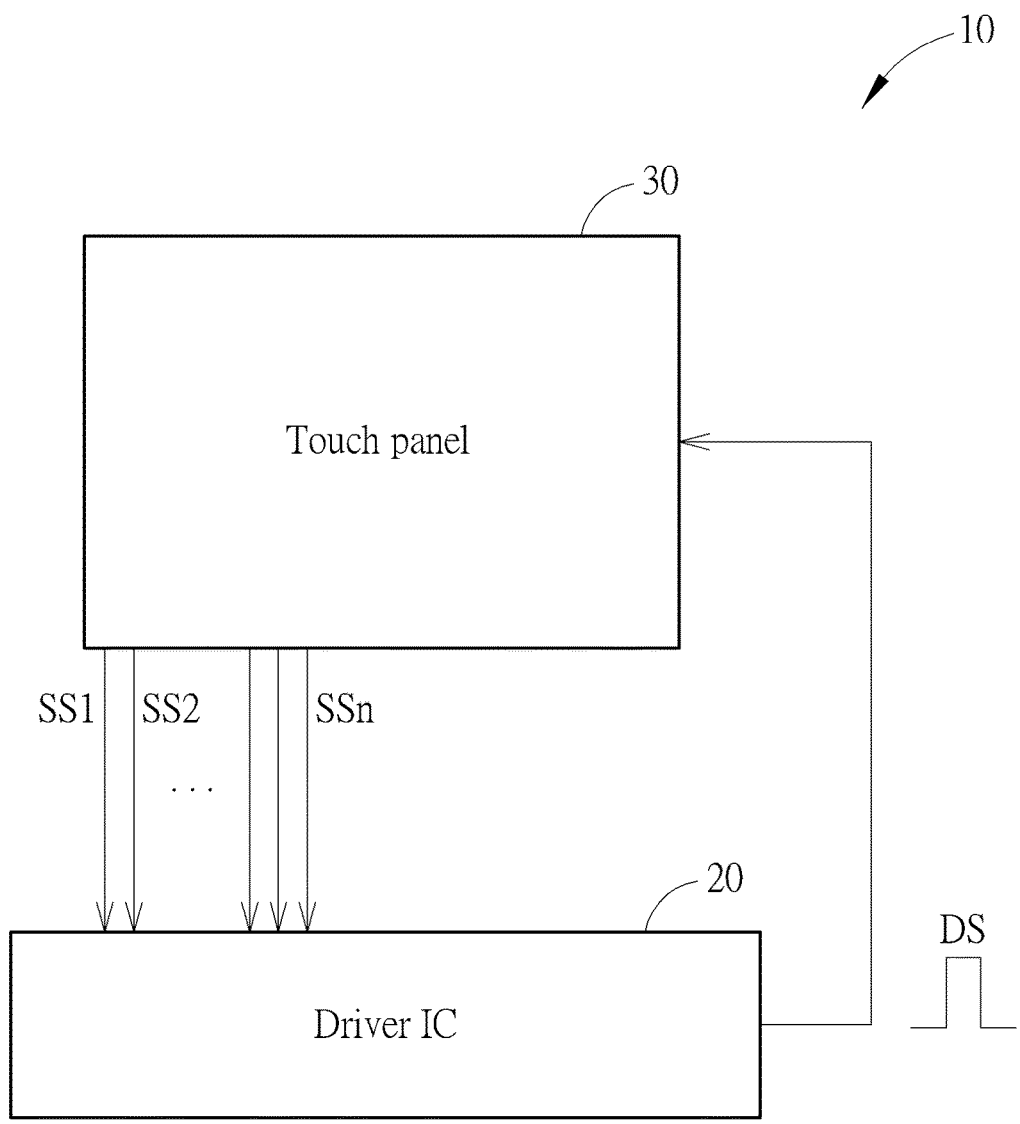
FIG. 1 is a diagram illustrating a touch-controlled system according to an embodiment of the present invention.

FIG. 1 is a diagram illustrating a touch-controlled system 10 according to an embodiment of the present invention. The touch-controlled system 10 comprises a driver IC 20 and a touch panel 30, wherein the driver IC 20 is arranged to detect an occurrence of a touch event on the touch panel 30 when it operates in the touch sensing mode by sending a driving signal DS to the touch panel 30 and receiving sensing signals SS1-SSn from the touch panel 30. The driving signal DS may be a pulse signal.

Figure 2:
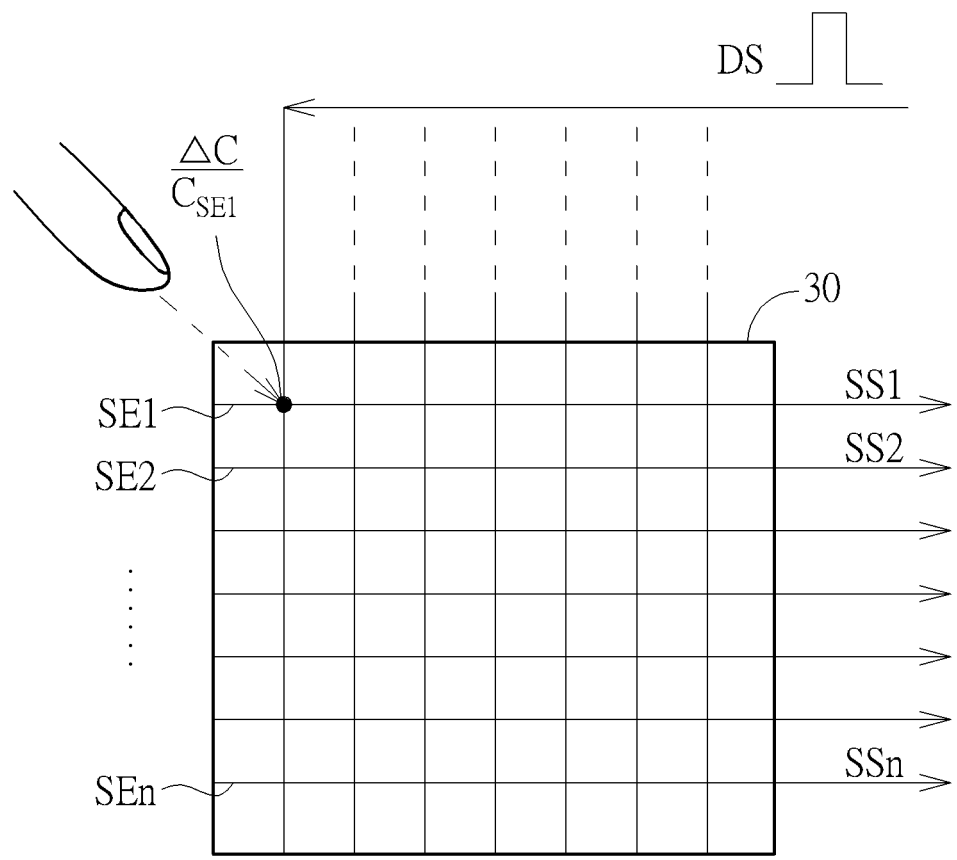
FIG. 2 is a diagram illustrating a touch panel according to an embodiment of the present invention.

FIG. 2 is a diagram illustrating the touch panel 30 according to an embodiment of the present invention. As shown in FIG. 2, the touch panel 30 comprises a plurality of sensing electrodes SE1-SEn, wherein the driving signal DS transmitted from the driver IC is received by each of the plurality of sensing electrodes SE1-SEn repeatedly and sequentially during the touch sensing mode. The sensing electrodes SE1-SEn accordingly transmit sensing signals SS1-SSn to the driver IC 20, respectively. More specifically, when a user 40 touches the touch panel (directly or indirectly) during the touch sensing mode, the sensing electrodes sense the touch. For example, the sensing electrode SE1 generates the sensing signal SS1 showing the occurrence of the touch event, wherein the sensing signal SS1 indicates a capacitance variation $\Delta C$ which occurs, and is transmitted to the driver IC 20. Assuming the capacitor of the sensing electrode SE1 is $C_{SE1}$, the sensitivity of the touch panel can be easily obtained as $\Delta C/C_{SE1}$. In this embodiment, the base capacitors from the sensing electrodes SE1-SEn are equal, and will be described as $C_{SE}$ in the following paragraphs. As mentioned in the description of the prior art, when the user 40 touches the touch panel 30 indirectly, for example, a user's palm is positioned above the touch panel 30 without touching the touch panel 30, the capacitance variation $\Delta C$ might be too small for the driver IC 20 to detect. Therefore, a high sensitivity of the touch-controlled system 10 is desired. When the user 40 touches the touch panel 30 directly, for example, a finger directly presses the touch panel 30, the capacitance variation $\Delta C$ might be strong enough for the driver IC 20. Therefore, a relatively low sensitivity is sufficient for the touch-controlled system 10. The present invention provides the driver IC 20 with the capability of adjusting the sensitivity of the touch panel 30 when the capacitance variation ΔC is too small. The detailed implementation is described in the following paragraphs.

When the sensing electrodes do not sense the touch, e.g. the sensing electrodes SE2-SEn generates sensing signals SS2-SSn, wherein each of the sensing signals SS2-SSn indicates there is no capacitance variation, this result is transmitted to the driver IC 20. In this embodiment, the touch panel 20 employs a mutual-capacitor touch detecting scheme. In other words, the capacitance variation ΔC mentioned above is a variation of mutual capacitance between the sensing electrode being touched and its adjacent sensing electrodes. This is only for illustrative purposes, however. In other embodiments, the touch panel 30 employs the self-capacitor touch detecting scheme instead.

Figure 3:
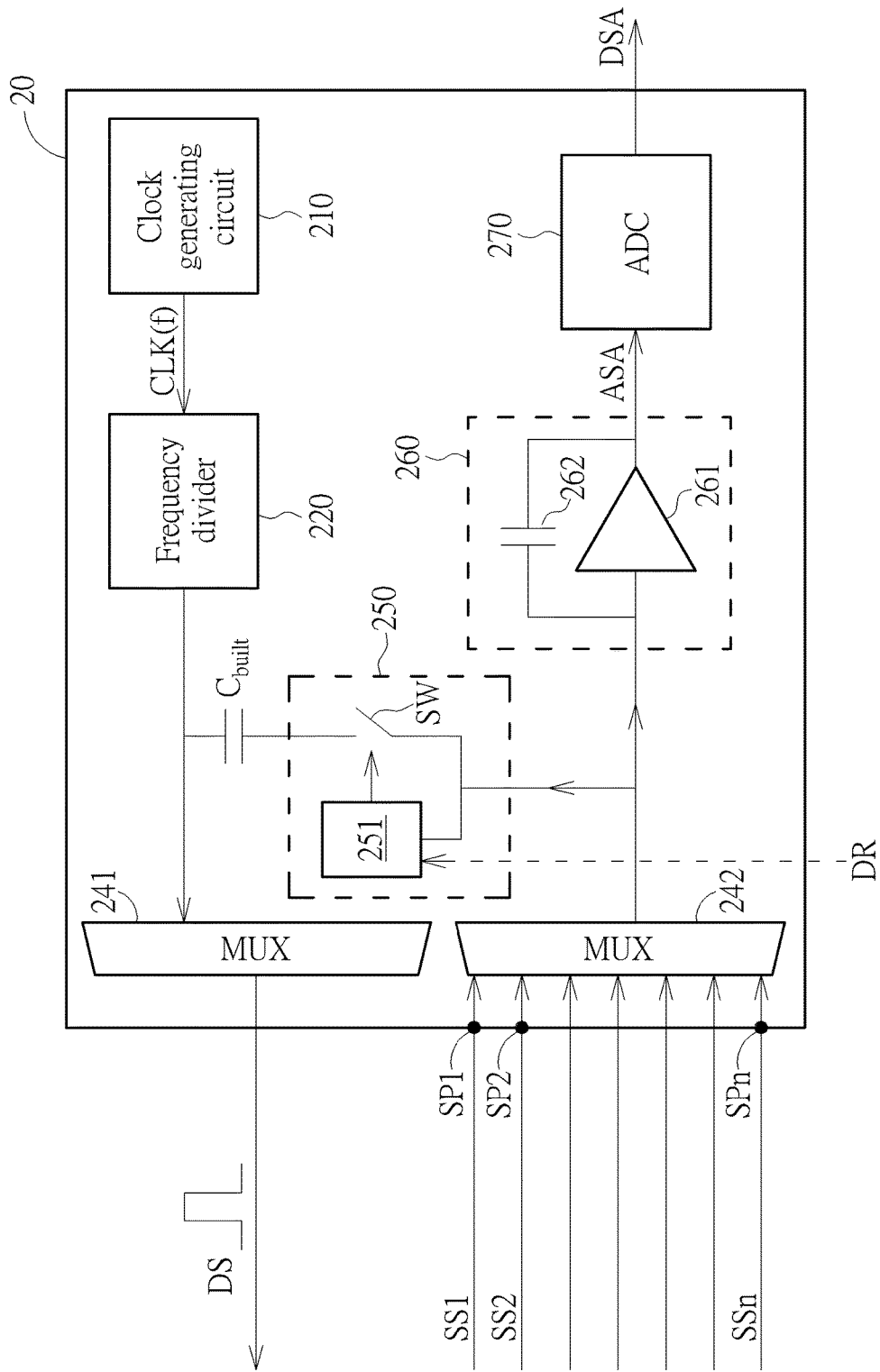
FIG. 3 is a diagram illustrating a driver IC according to an embodiment of the present invention.

FIG. 3 is a diagram illustrating the driving IC 20 according to an embodiment of the present invention. As shown in FIG. 3, the driver IC 20 comprises a clock generating circuit 210, a frequency divider 220, a built-in capacitor $C_{built}$, multiplexers 241 and 242, a coupling circuit 250, a reading circuit 260 and an Analog-to-Digital converter (ADC) 270. In addition, the sensing signals SS1-SSn transmitted from the touch panel 30 are received by a plurality of sensing pins SP1-SPn, respectively. It should be noted that the sensing pins SP1-SPn in this embodiment, are installed outside the driver IC 20; however, this is not a limitation of the present invention. The clock generating circuit 210 is arranged to generate a clock signal CLK with a frequency f. The frequency divider 220 coupled to the clock generating circuit 210 is arranged to perform a frequency division upon the clock signal CLK in order to generate the driving signal DS, wherein the driving signal DS may be a pulse signal as mentioned above. The multiplexer 241 receives the driving signal DS and transmits it to each of the plurality of sensing electrodes SE1-SEn repeatedly and sequentially during the touch sensing mode. The multiplexer 242 receives the sensing signals SS1-SSn via the sensing pins SP1-SPn repeatedly and sequentially, wherein each of the sensing signals SS1-Sn indicates whether a touch event is sensed. The reading circuit 260 comprises an amplifier 261 and a capacitor 262, wherein the reading circuit 260 acts as a current amplifier to receive the sensing signals SS1-SSn from the multiplexer 242 repeatedly and sequentially, and processes the sensing signals SS1-SSn to generate an analog sensing data ASA to the ADC 270 for advanced processes. The ADC 270 converts the analog sensing data ASA to a digital sensing data DSA, and sends the digital sensing data DSA to the back-end circuits of the touch-controlled system 10 (not shown in FIG. 1). The coupling circuit 250 comprises a control circuit 251 and a switch SW, wherein the control circuit 251 receives the sensing signals SS1-SSn from the touch panel to detect the occurrence of a touch event. When the touch is sensed, the control circuit 251 compares a number of sensing signals from the sensing electrodes sensing the touch event to a predetermined value, and generates a control signal CS to control the switch SW. The switch SW is controlled by the control signal CS to determine whether to couple the built-in capacitor $C_{built}$ to the touch panel 30 for dynamically adjusting the sensitivity.

More specifically, when the number of sensing electrodes sensing the touch event is greater than the predetermined value, indicating a large area of the touch panels is covered (e.g. by a user's palm) but not touched, a relatively high sensitivity is desired for this application. Therefore, in order to increase the sensitivity, the control circuit 251 generates the control signal CS to switch off the switch SW for disconnecting the built-in capacitor $C_{built}$ from the touch panel 30. In this case, the built-in capacitor $C_{built}$ is disconnected from the capacitor of the sensing electrode $C_{SE}$. Therefore, the sensitivity is maintained at $\Delta C/C_{SE}$.

When the number of sensing electrodes sensing the touch event is not greater than the predetermined value, indicating a small area of the touch panel 30 is directly touched (e.g. by a finger), a relatively low sensitivity is enough for this application. The control circuit 251 generates the control signal CS to switch on the switch SW to couple the built-in capacitor $C_{built}$ to the touch panel 30. In this case, the built-in capacitor $C_{built}$ is connected to the capacitor of the sensing electrode $C_{SE}$ in parallel. Therefore, the sensitivity can be easily obtained as $\Delta C/(C_{SE}//C_{built})$ which is lower than $\Delta C/C_{SE}$.

In the abovementioned embodiment, the switch SW is controlled to be on or off in order to determine whether to couple the built-in capacitor $C_{built}$ to the touch panel 30 in parallel. This is not a limitation of the present invention, however. Those skilled in the art should readily understand that by implementing the switch SW and the built-in capacitor $C_{built}$ at different places in the driver IC 20, the built-in capacitor $C_{built}$ can be coupled to the touch panel 30 in series. In this case, the sensitivity of the touch panel 30 can also be dynamically adjusted by coupling the built-in capacitor $C_{built}$ to the touch panel 30 in series. For example, when the number of sensing electrodes sensing the touch event is greater than the predetermined value, the control circuit 251 may generate the control signal CS to switch on the switch SW for coupling the built-in capacitor $C_{built}$ to the touch panel 30 in series.

When the number of sensing electrodes sensing the touch event is not greater than the predetermined value, the control circuit 251 may generate the control signal CS to switch off the switch SW for disconnecting the built-in capacitor $C_{built}$ from the touch panel 30.

It should be noted that the built-in capacitor $C_{built}$ may be implemented by a capacitor array comprising a plurality of capacitors and the capacitance of the built-in capacitor $C_{built}$ may be adjusted by changing the connection of the plurality of capacitor comprised therein. In this way, the sensitivity of the touch panel can be more flexible. Those skilled in the art should readily understand the implementation of the capacitor array and the associated control unit for controlling the capacitor. The detailed description is omitted here for brevity.

In the abovementioned embodiment, the driver IC 20 adjusts the sensitivity of the touch panel based on the number of sensing electrodes sensing the touch event. This is not a limitation of the present invention, however. In other embodiments, the touch-controlled system 10 may determine whether the current application needs a relatively high sensitivity or a low sensitivity via a different method. For example, the touch-controlled system 10 may comprise at least one sensor (not shown in FIG. 1), wherein the sensor detects a user's movement to determine that the current application needs a relatively high sensitivity or a low sensitivity, and transmits the detecting report DR to the control circuit 251. The control circuit 251 generates the control signal CS to the switch SW to control the on/off status of the switch SW according to the detecting report DR. This is, however, for illustrative purposes only; as long as the driver IC adjusts the sensitivity of the touch panel by coupling a built-in capacitor $C_{built}$ to the touch panel, this embodiment falls within the scope of the present invention.

In the abovementioned embodiment, the touch panel 30 can be a touch pad of a laptop. In other embodiments, the touch panel 30 can be a touch display panel of an electronic device, e.g. a smart phone, a tablet, or a personal digital assistant (PDA), etc. When the touch panel 30 is a touch display panel, the driver IC 20 may selectively operate in a display mode and the touch sensing mode, and when the driver IC operates in the display mode, the driver IC 20 outputs display data to a plurality of sensing electrodes of the touch panel 30. Those skilled in the art should readily understand the implementation of a driver IC applied to a touch display panel. The detailed description is omitted here for brevity.

Briefly summarized, the present invention provides a touch-controlled system comprising a touch panel and a driver IC coupled to the touch panel, wherein the driver IC is capable of dynamically adjusting the sensitivity of the touch panel by coupling a built-in capacitor to the touch panel either in parallel or series according to different applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driver integrated circuit (IC), comprising:
   a built-in capacitor installed within the driver IC to be externally connected to a touch panel;
   a reading circuit, arranged to receive a sensing signal from the touch panel and output an analog sensing data;
   an Analog-to-Digital converter (ADC), coupled to the reading circuit, wherein the ADC is arranged to receive and convert the analog sensing data to a digital sensing data; and
   a coupling circuit, coupled to the reading circuit, wherein the coupling circuit is arranged to selectively couple the built-in capacitor to a plurality of sensing electrodes of the touch panel via a plurality of sensing pins outside the driver IC when the driver IC operates in a touch sensing mode;
   wherein the coupling circuit comprises:
      a control circuit, arranged to receive the sensing signal from at least one of a plurality of sensing electrodes of the touch panel to detect occurrence of a touch event, and is further arranged to compare a number of sensing electrodes sensing the touch event with a predetermined value when the touch event is detected, and generate a control signal; and
      a switch, coupled between the reading circuit and the built-in capacitor, wherein the switch couples the built-in capacitor to the touch panel according to the control signal.

2. The driver IC of claim 1, wherein when the built-in capacitor is coupled to the touch panel via the switch of the coupling circuit, and the built-in capacitor and the touch panel are connected in parallel.

3. The driver IC of claim 2, wherein when the number of sensing electrodes sensing the touch event is not greater than the predetermined value, the built-in capacitor is coupled to the touch panel via the coupling circuit; and when the number of sensing electrodes sensing the touch event is greater than the predetermined value, the built-in capacitor is not coupled to the touch panel via the coupling circuit.

4. The driver IC of claim 1, wherein when the built-in capacitor is coupled to the touch panel via the coupling circuit, the built-in capacitor and the touch panel are connected in series.

5. The driver IC of claim 4, wherein when the number of sensing electrodes sensing the touch event is not greater than the predetermined value, the built-in capacitor is not coupled to the touch panel via the coupling circuit; and when the number of sensing electrodes sensing the touch event is greater than the predetermined value, the built-in capacitor is coupled to the touch panel via the coupling circuit.

6. The driver IC of claim 1, wherein the reading circuit receives the sensing signal via a sensing pin outside the driver IC.

7. The driver IC of claim 1, wherein the sensing signal is outputted from one of a plurality of sensing electrodes of the touch panel.

8. The driver IC of claim 1, further comprising:
   a clock generating circuit, arranged to generate a clock signal; and
   a frequency divider, coupled to the clock generating circuit, wherein the frequency divider is arranged to perform a frequency division upon the clock signal to generate a driving signal, and the driving signal is sent to each of a plurality of sensing electrodes of the touch panel, sequentially and repeatedly.

9. The driver IC of claim 1, wherein the touch panel is a touch display panel, the driver IC selectively operates in a display mode and the touch sensing mode, and when the driver IC operates in the display mode, the driver IC outputs display data to a plurality of sensing electrodes of the touch panel.

10. A driving method of a touch panel, comprising:
    receiving a sensing signal from the touch panel;
    outputting an analog sensing data;
    performing an analog-to-digital conversion upon the analog sensing data to convert the analog sensing data to a digital sensing data; and
    selectively coupling a built-in capacitor to a plurality of sensing electrodes of the touch panel via a plurality of sensing pins outside a driver IC when operating in a touch sensing mode, the built-in capacitor being installed within the driver IC to be externally connected to the touch panel;
    wherein selectively coupling the built-in capacitor to the touch panel when operating in the touch sensing mode comprises:
       receiving the sensing signal from at least one of a plurality of sensing electrodes of the touch panel to detect occurrence of a touch event;
       when the touch event is detected, comparing a number of sensing electrodes sensing the touch event with a predetermined value, and generating a control signal; and
       coupling the built-in capacitor to the touch panel according to the control signal.

11. The driving method of claim 10, further comprising:
    coupling the built-in capacitor to the touch panel in parallel.

12. The driving method of claim 11, wherein when the number of sensing electrodes sensing the touch event is not greater than the predetermined value, the built-in capacitor is coupled to the touch panel according to the control signal; and when the number of sensing electrodes sensing the touch event is greater than the predetermined value, the built-in capacitor is not coupled to the touch panel according to the control signal.

13. The driving method of claim 10, further comprising:
coupling the built-in capacitor to the touch panel in series.

14. The driving method of claim 13, wherein when the number of sensing electrodes sensing the touch event is not greater than the predetermined value, the built-in capacitor is not coupled to the touch panel according to the control signal; and when the number of sensing electrodes sensing the touch event is greater than the predetermined value, the built-in capacitor is coupled to the touch panel according to the control signal.

15. The driving method of claim 10, further comprising:
generating a clock signal;
performing a frequency division upon the clock signal to generate a driving signal; and
sending the driving signal to each of a plurality of sensing electrodes of the touch panel, sequentially and repeatedly.

16. The driving method of claim 10, wherein the sensing signal is outputted from each of the plurality of sensing electrodes of the touch panel.

17. The driving method of claim 10, wherein the touch panel is a touch display panel, and the driving method further comprises:
selectively operating in a display mode and the touch sensing mode; and
when operating in the display mode, outputting a display data to the plurality of sensing electrodes.

18. A touch-controlled system, comprising:
a touch panel; and
a driver integrated circuit (IC), coupled to the touch panel, comprising:
a built-in capacitor installed within the driver IC externally connected to the touch panel;
a reading circuit, arranged to receive a sensing signal from the touch panel and output an analog sensing data;
an Analog-to-Digital converter (ADC), coupled to the reading circuit, wherein the ADC is arranged to receive and convert the analog sensing data to a digital sensing data; and
a coupling circuit, coupled to the reading circuit, wherein the coupling circuit is arranged to selectively couple the built-in capacitor to a plurality of sensing electrodes of the touch panel via a plurality of sensing pins outside the driver IC when the driver IC operates in a touch sensing mode;
wherein the coupling circuit comprises:
a control circuit, arranged to receive the sensing signal from at least one of a plurality of sensing electrodes of the touch panel to detect occurrence of a touch event, and is further arranged to compare a number of sensing electrodes sensing the touch event with a predetermined value when the touch event is detected, and generate a control signal; and
a switch, coupled between the reading circuit and the built-in capacitor, wherein the switch couples the built-in capacitor to the touch panel according to the control signal.

* * * * *